(12) United States Patent
Park et al.

(10) Patent No.: US 7,700,952 B2
(45) Date of Patent: Apr. 20, 2010

(54) CONTACT PAD FOR THIN FILM TRANSISTOR SUBSTRATE AND LIQUID CRYSTAL DISPLAY

(75) Inventors: Yong Han Park, Anyang-Si (KR); Kee Han Uh, Yongin-Si (KR); Ae Shin, Suwon-Si (KR); Yong Koo Her, Yongin-Si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/733,985

(22) Filed: Apr. 11, 2007

(65) Prior Publication Data

US 2007/0236624 A1    Oct. 11, 2007

(30) Foreign Application Priority Data

Aug. 29, 2006    (KR) .................... 10-2006-0082269

(51) Int. Cl.
  *H01L 29/04*    (2006.01)
  *H01L 31/036*   (2006.01)
  *H01L 23/48*    (2006.01)
  *H01L 23/52*    (2006.01)

(52) U.S. Cl. .................... 257/72; 257/59; 257/779; 257/E27.111

(58) Field of Classification Search ................ 257/203, 257/208, 773, 779, 59, 72, E27.111
See application file for complete search history.

(56) References Cited

U.S. PATENT DOCUMENTS

| 5,841,193 | A  | * | 11/1998 | Eichelberger | ............... 257/723 |
| 6,847,124 | B2 | * | 1/2005  | Semi         | ............... 257/786 |
| 6,984,895 | B2 | * | 1/2006  | Cho et al.   | ............... 257/781 |
| 7,019,805 | B2 | * | 3/2006  | Kim et al.   | ............... 349/129 |
| 2001/0020986 | A1 | * | 9/2001 | Ikeda et al. | ............... 349/12 |
| 2003/0122979 | A1 | * | 7/2003 | Morimitsu    | ............... 349/42 |
| 2004/0095539 | A1 | * | 5/2004 | Lee et al.   | ............... 349/129 |
| 2005/0134764 | A1 | * | 6/2005 | Jeoung et al.| ............... 349/110 |
| 2005/0243234 | A1 | * | 11/2005 | Jung        | ............... 349/43 |

* cited by examiner

*Primary Examiner*—Shouxiang Hu
(74) *Attorney, Agent, or Firm*—Innovation Counsel LLP

(57) ABSTRACT

A contact pad is disclosed including a first electrode pattern with an open portion inside, an insulation layer formed on the first electrode pattern and having a contact via portion formed therein, and a second electrode pattern formed on the insulation layer and electrically connected to the first electrode pattern through the contact via portion. The second electrode pattern comprises single electrode patterns spaced apart from one another. A thin film transistor substrate and a liquid crystal display panel having the contact pad are also disclosed.

8 Claims, 6 Drawing Sheets

CONTACT PAD FOR THIN FILM TRANSISTOR SUBSTRATE AND LIQUID CRYSTAL DISPLAY

BACKGROUND OF THE INVENTION

1. Field of Invention

The present invention relates to a contact pad, and a thin film transistor substrate and a liquid crystal display panel having the same. More particularly, the present invention relates to a contact pad formed as a structure for increasing corrosion resistance and durability, and a thin film transistor substrate and a liquid crystal display panel having the contact pad.

2. Description of the Prior Art

A liquid crystal display (LCD) is advantageous for being lightweight, and can be used in both small and large screen applications in comparison to a conventional cathode ray tube (CRT), so that LCD research and development are actively pursued. The LCD is used in various display applications, e.g., desktop computer monitors, large displays for home video and projection and small displays for mobile devices. The application range for LCDs is rapidly expanding. To display an image on an LCD panel, an LCD controls light transmissivity according to image signals applied to control switches arranged in a matrix. An LCD typically includes an LCD panel having a liquid crystal layer provided between a color filter substrate and a thin film transistor (TFT) substrate, an LCD driving integrated circuit (IC) for operating the LCD panel, a backlight unit used as a light source of the LCD, and a chassis for integrating the above components of the LCD. Contacts are provided to electrically connect the TFT substrate and the color filter substrate.

Contact pads are formed in a peripheral region of the TFT substrate for connecting to a common electrode formed on the color filter substrate, so as to provide a common voltage to both electrodes.

Since the connection is positioned between the contact pad of the TFT substrate and the common electrode of the color filter substrate, the connection is compressed by both substrates. As a result, a trace may be compressed by the common electrode of the color filter substrate, i.e., an impression, is left on the contact pad. If a contact pad is thereafter exposed to humidity, corrosion may spread, so that the entire contact pad may become corroded. Consequently, since a common voltage may no longer be uniformly applied to the common electrode of the color filter substrate, failures in the display may result.

SUMMARY

The present invention solves the aforementioned problems. An object of the present invention is to provide a contact pad that increases corrosion resistance and durability and to provide a thin film transistor substrate and a liquid crystal display panel having the contact pads.

According to an aspect of the present invention, there is provided a contact pad comprising a first electrode pattern with an open portion formed in an inside region, an insulation layer formed on the first electrode pattern with contact vias formed therein, and a second electrode pattern formed on the insulation layer and electrically connected to the first electrode pattern through the contact vias. The second electrode pattern comprises individual electrode patterns that are spaced apart from one another.

The first and second electrode patterns may be made of a conductive material (e.g., a metal).

The open portion may comprise openings that are spaced apart from one another at a predetermined interval.

The first electrode pattern may be formed as a lattice.

The contact vias may be spaced apart from one another at a predetermined interval.

The number and positions of the individual electrode patterns may correspond to those of the contact vias.

According to another aspect of the present invention, there is provided a thin film transistor substrate, comprising a substrate, gate lines formed in one direction on the substrate, data lines formed to intersect the gate lines while being insulated therefrom, unit pixels formed at the intersections of the gate and data lines, and a contact pad formed in a peripheral region of the substrate. The contact pad comprises a first electrode pattern with an open portion formed inside, an insulation layer formed on the first electrode pattern with one or more contact vias formed therein, and a second electrode pattern formed on the insulation layer and electrically connected to the first electrode pattern through the contact vias. The second electrode pattern comprises individual electrode patterns spaced apart from one another.

Each of the unit pixels may comprise a thin film transistor having gate and source-drain electrodes respectively connected to the corresponding gate and data lines, and a pixel electrode connected to the thin film transistor.

The first electrode pattern may be made of the same material as the gate or data line.

The second electrode pattern may be made of the same material as the pixel electrode.

According to a further aspect of the present invention, there is provided a liquid crystal display panel, comprising a thin film transistor substrate including a first substrate, unit pixels formed on the first substrate by thin film transistors and pixel electrodes, and a contact pad formed in a peripheral region of the first substrate, a color filter substrate including a second substrate, color filters formed on the second substrate, and a common electrode formed on the color filters, and a conductive contact for electrically connecting the contact pad and the common electrode. The contact pad comprises a first electrode pattern with an open portion formed inside, an insulation layer formed on the first electrode pattern and having one or more contact vias formed therein, and a second electrode pattern formed on the insulation layer and electrically connected to the first electrode pattern through the contact vias. The second electrode pattern comprises individual electrode patterns spaced apart from one another.

The contact vias provide electrical connections between the first electrode pattern and the second electrode pattern.

The contact may be made of a conductive silver paste or a mixture of a resin and a spacer coated with a conductive material.

BRIEF DESCRIPTION OF THE FIGURES

The above and other objects, features and advantages of the present invention will become apparent from the following description of a preferred embodiment given in conjunction with the accompanying drawings, in which.

DETAILED DESCRIPTION

Hereinafter, a preferred embodiment of the present invention will be described in detail with reference to the accompanying drawings.

Figure 1A:
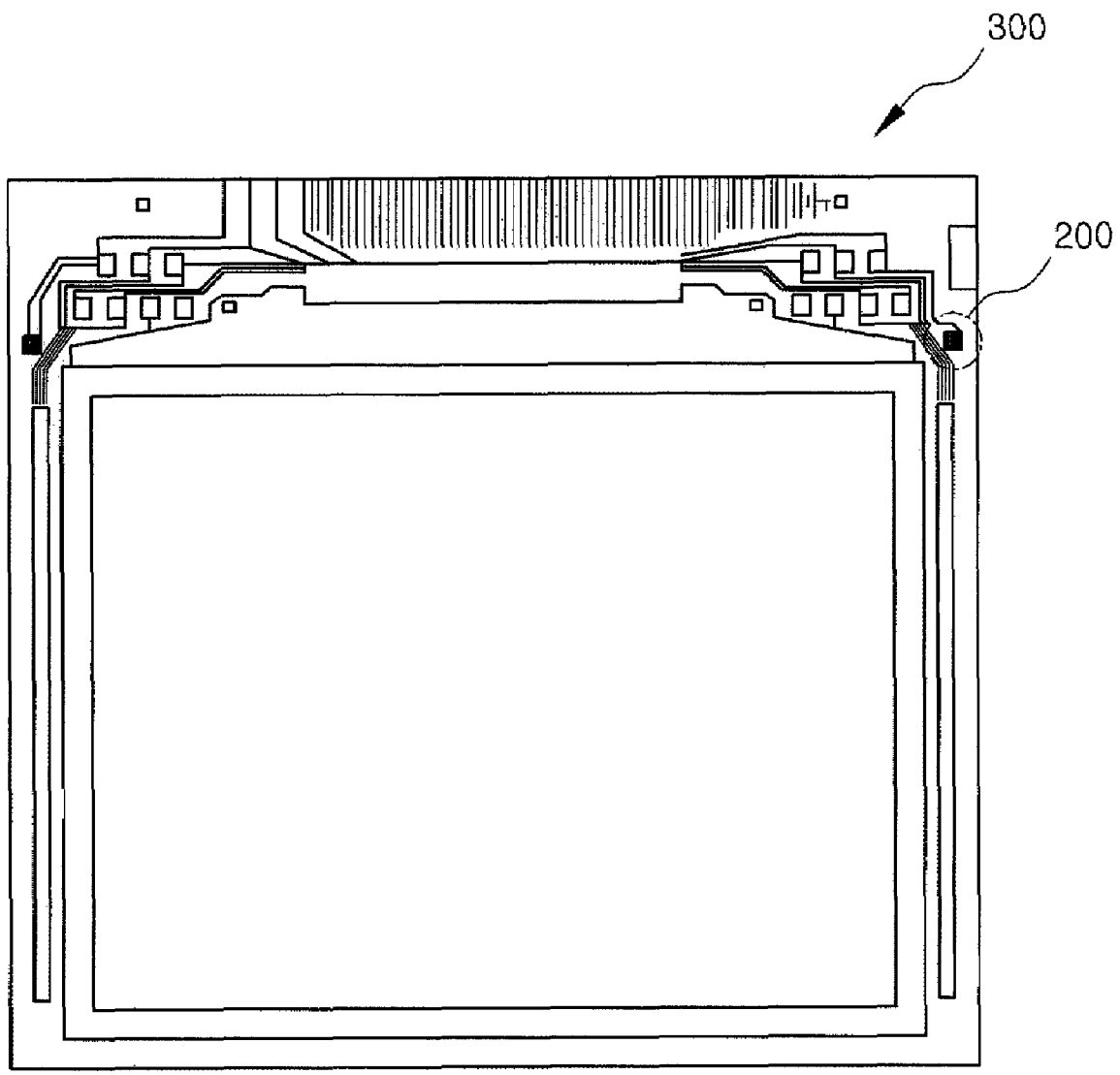
FIGS. 1A and 1B are a schematic plan view and a partially enlarged view showing a thin film transistor (TFT) substrate with contact pads, respectively.
Figure 1B:
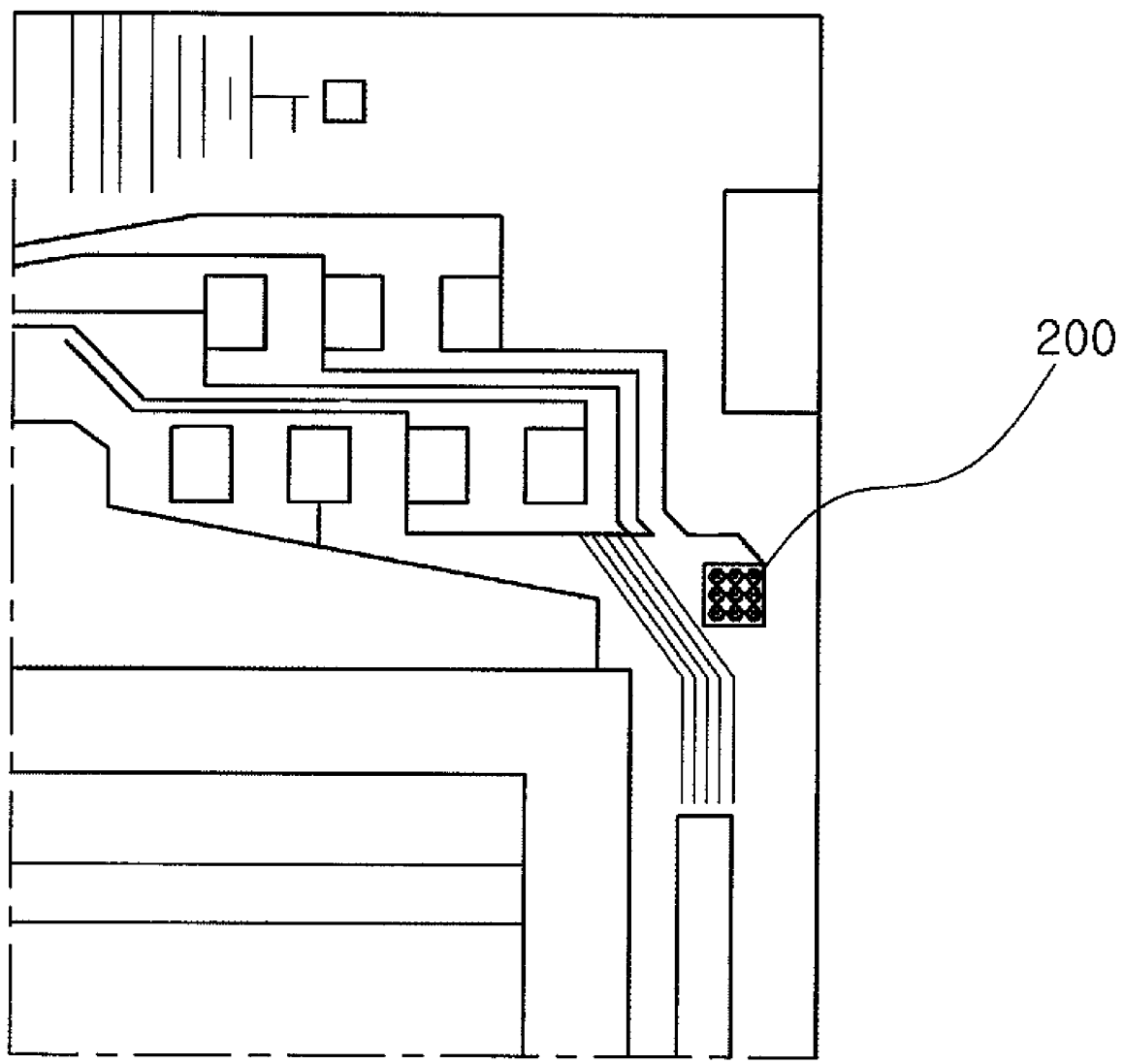

FIGS. 1A and 1B are a schematic plan view and a partially enlarged view showing a thin film transistor (TFT) substrate 300 with one or more contact pads 200, respectively.

Referring to FIGS. 1A and 1B, in a display region (i.e., an inside region of TFT substrate 300), there are formed TFTs (not shown) that are switching elements for applying and cutting off signal voltages to a liquid crystal. The display region includes pixel electrodes (not shown) made of a transparent and conductive material for applying the signal voltages to the liquid crystal cells, and storage capacitors (not shown) for sustaining the signal voltage in the pixel electrodes for a certain period of time.

Contact pads 200 are formed in a non-display region (i.e., a peripheral region of TFT substrate 300). An electrode pattern (not shown) is also formed on each of contact pads 200 for electrical connection. During operation, a common voltage is applied through contact pads 200 to a common electrode of a color filter substrate and electrodes formed on the TFT substrate 300.

Contact pads 200 may be formed at the left and right upper corner regions, as shown in the present embodiment, for example. The number and positions of the contact pads are not limited. Various numbers of contact pads may be formed in various positions in the peripheral region of TFT substrate 300.

Figure 2:
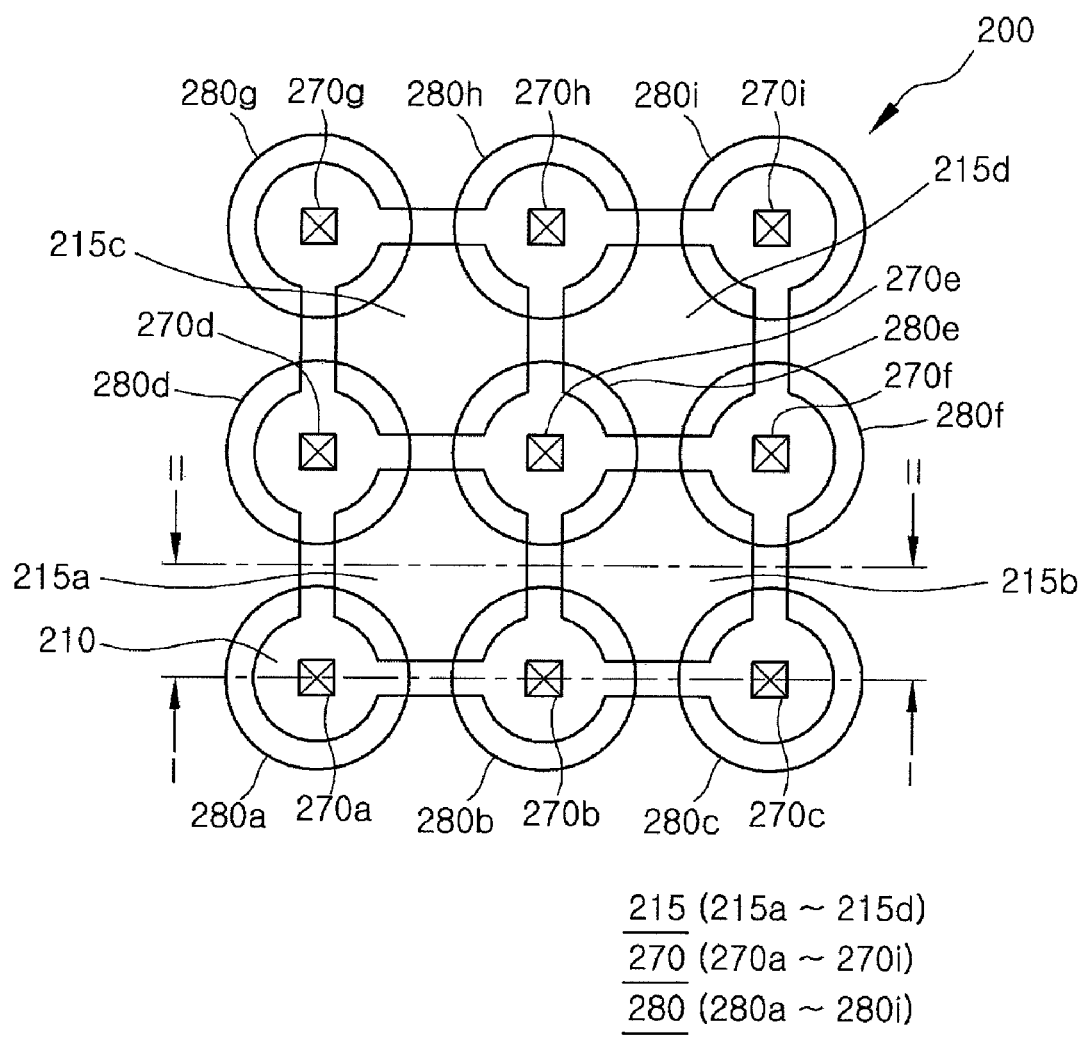
FIG. 2 is a schematic plan view showing the contact pad, according to one embodiment of the present invention.
Figure 3A:
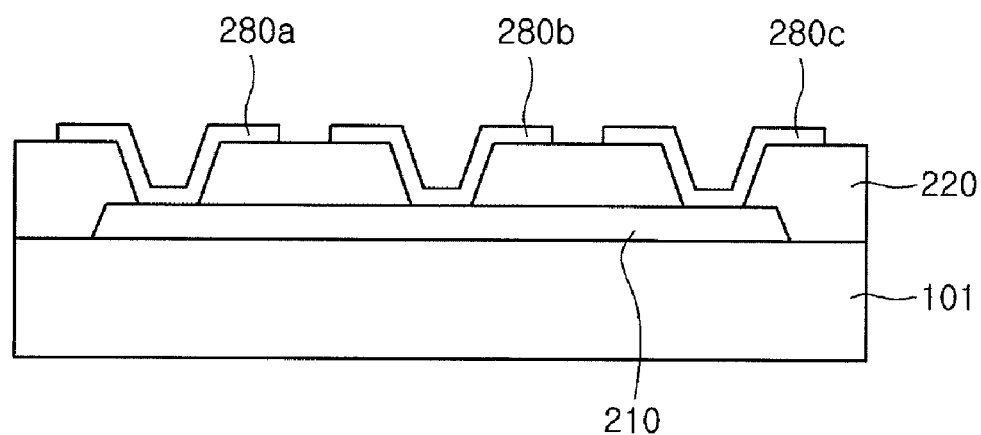
FIGS. 3A and 3B are sectional views of the contact pad taken along lines I-I and II-II shown in FIG. 2, respectively.
Figure 3B:
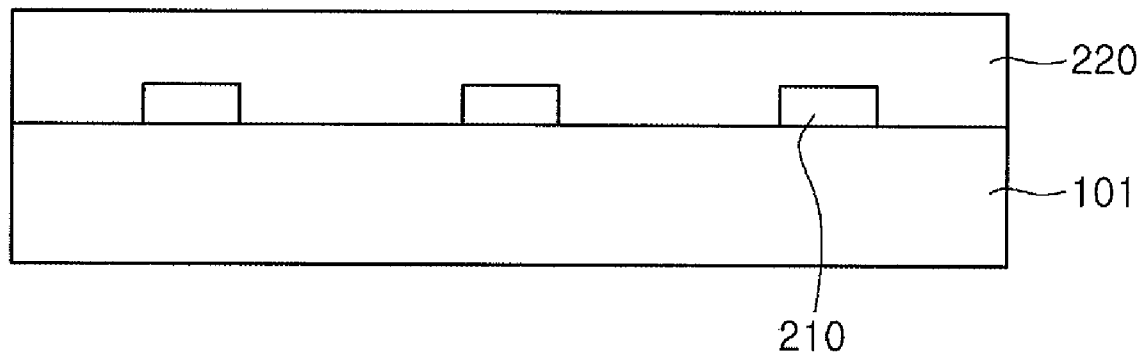

FIG. 2 is a schematic plan view showing contact pad 200 according to the present invention; and FIGS. 3A and 3B are sectional views of contact pad 200 taken along lines I-I and II-II shown in FIG. 2, respectively.

Referring to FIGS. 2, 3A and 3B, contact pad 200 comprises a substrate 101, a first electrode pattern 210, an open portion 215, an insulation layer 220, a contact via portion 270 and a second electrode pattern 280

The first electrode pattern 210 is formed on the substrate 101 in a generally square shape. The open portion 215 is formed inside first electrode pattern 210, so that the substrate is exposed at open portion 215. First contact pattern 210 may be square, or another shape and may be made of a conductive or metallic material.

As shown in FIG. 2, open portion 215 comprises first, second, third and fourth openings 215a, 215b, 215c and 215d. The openings may be spaced apart from one another at a predetermined interval. In FIG. 2, each of openings 215a to 215d is formed as a square from which a corner is cut away along a circular arc. This shape is merely exemplary; many other shapes may be used.

As described above, openings 215a to 215d are arranged inside of first electrode pattern 210 and spaced apart from one another at a predetermined interval. First electrode pattern 210 is generally formed as a lattice. In that form, even though corrosion may progress in one portion of first electrode pattern 210, the rate at which the corrosion progresses to other regions may be reduced by open portion 215 formed inside first electrode pattern 210.

The insulation layer 220 is formed on the entire surface of substrate 101 on which first electrode pattern 210 is formed, and contact via portion 270 is formed in insulation layer 220 to expose first electrode pattern 210. For example, contact via portion 270 comprises a number of contact vias (e.g., first to ninth contact vias 270a to 270i). The contact vias 270a to 270i are formed above the first electrode pattern 210 and spaced apart from one another at a predetermined interval. Contact vias 270a to 270i avoid the open portion 215 of the first electrode pattern 210, thus to expose the first electrode pattern 210. Although, as an example, nine contact vias 270a to 270i are formed in this embodiment, the number, positions and shapes of the contact vias are not so limited.

The second electrode pattern 280, which is made of a conductive or metallic material, is formed on insulation film 220 with contact via portion 270 formed therein. Second electrode pattern 250 is in contact with and electrically connected to first electrode pattern 210 through contact via portion 270. For example, second electrode pattern 280 comprises a plurality of single electrode patterns (e.g., first to ninth single electrode patterns 280a to 280i) are spaced apart from one another at a predetermined interval. In an embodiment of the present invention, each of the nine single electrode patterns 280a to 280i is circular. Further, the nine single electrode patterns 280a to 280i are respectively formed at positions corresponding to the nine contact vias 270a to 270i. However, the shape and positions of respective single electrode patterns 280a to 280i are merely exemplary and may be varied.

If electrode pattern 280 includes single electrode patterns 280a to 280i that are spaced apart from one another, even though a crack may occur in an individual single electrode pattern due to an external impact, the influence of the crack can be minimized since the crack may not progress to other single electrode patterns. Thus, the durability of electrode pattern 280 is enhanced. Further, even though corrosion may occur in an individual single electrode pattern (e.g., 280a), the corrosion is prevented from progressing to other single electrode patterns (e.g., 280b to 2080i) since the single electrode patterns are spaced apart from one another. Accordingly, improved corrosion resistance may be obtained.

Figure 4:
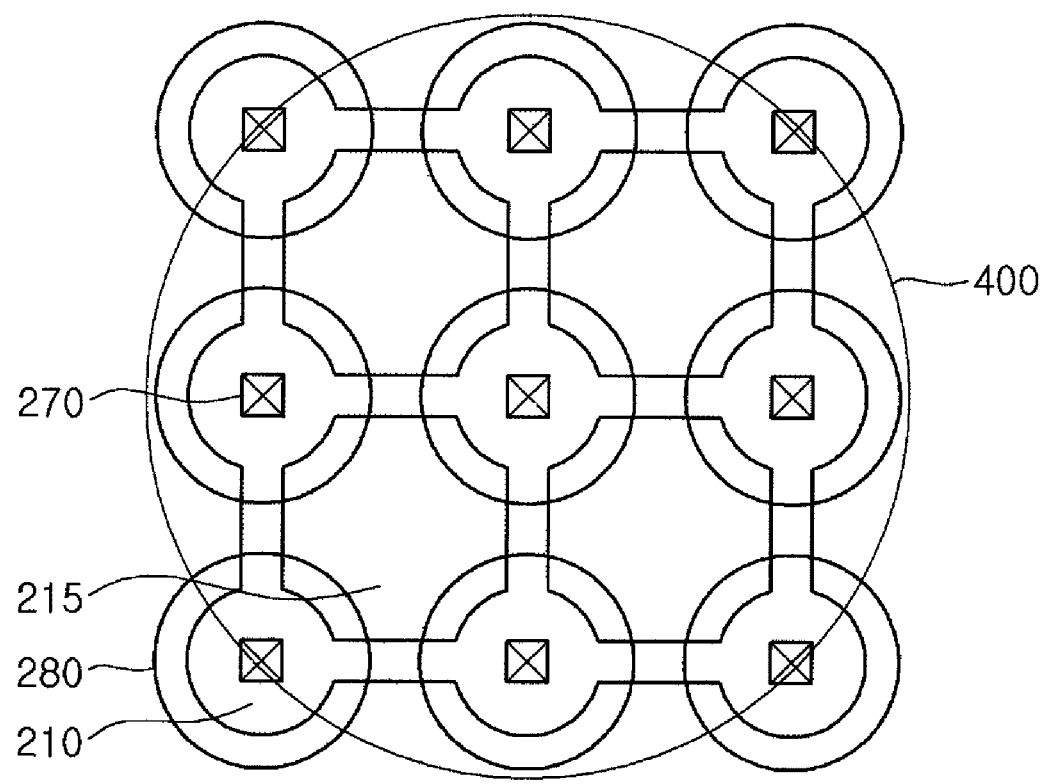
FIG. 4 is a plan view showing a second electrode pattern positioned above a first electrode pattern according to an embodiment of the present invention.
Figure 5:
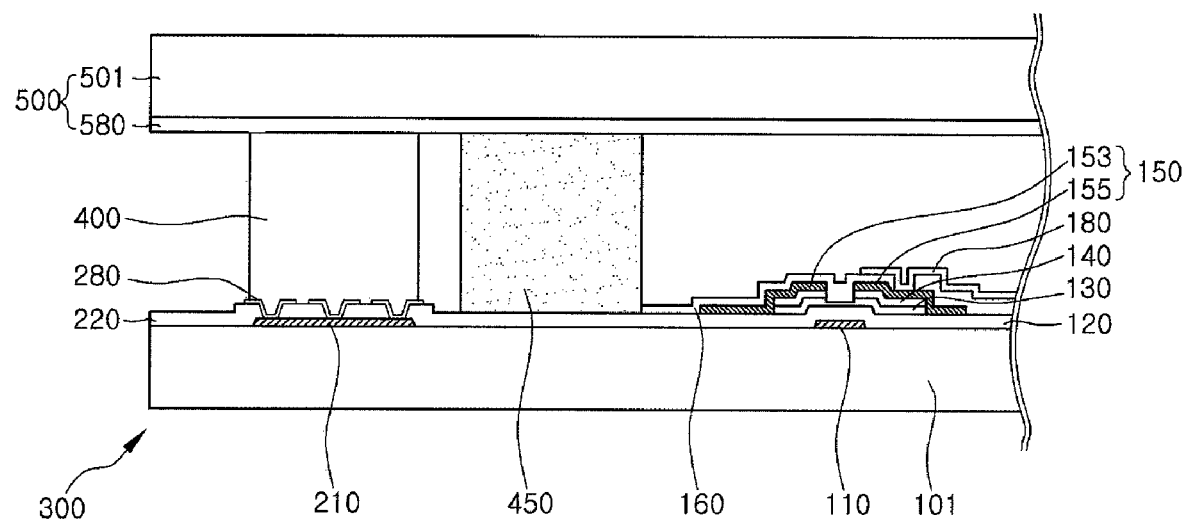
FIG. 5 is a schematic sectional view showing a liquid crystal display (LCD) panel having the TFT substrate with the contact pad according to an embodiment of the present invention.

FIG. 4 is a plan view showing electrode pattern 280 positioned above first electrode pattern 210 according to an embodiment of the present invention; FIG. 5 is a schematic sectional view showing an LCD panel having TFT substrate 300 with contact pad 200 according to an embodiment of the present invention.

Referring to FIGS. 4 and 5, the LCD panel comprises TFT substrate 300, a color filter substrate 500, a liquid crystal layer (not shown) injected between both the substrates, a seal pattern 450 for bonding both the substrates, and a conductive contact 400 for electrically connecting the TFT substrate 300 and the color filter substrate 500.

Color filter substrate 500 comprises substrate 501, and a black matrix (not shown), a color filter (not shown) and common electrode 580 sequentially formed on substrate 501. The black matrix is formed between the color filter and a pixel to shield leaking light, and the color filter is made of a resin film containing dyes or pigments of three basic colors (red, green and blue). Further, common electrode 580, which is an electrode made of a transparent electrical conductor, such as indium tin oxide (ITO) or indium zinc oxide (IZO), is provided to apply a voltage to pixels (not shown) of the liquid crystal layer.

On TFT substrate 300, there are provided gate lines (not shown) formed in one direction, data lines (not shown) formed to intersect, but insulated from, the gate lines. Individual pixels are formed where the gate and data lines intersect. At each pixel, a TFT is formed to act as a switching element for applying and cutting off a signal voltage to a cell of the liquid crystal layer, a pixel electrode 180 made of an electrically conductive transparent material, such as ITO or IZO, provided to apply the signal voltage to the TFT of the liquid crystal cell, and a storage capacitor (not shown) for sustaining the signal voltage applied to the pixel electrode for a period of time.

A spacer (not shown) is provided for maintaining a space between color filter substrate 500 and TFT substrate 300, and the liquid crystal layer (not shown) is interposed in that space. In order to bond color filter substrate 500 and TFT substrate 300, seal pattern 450 is formed in a peripheral portion of the substrates.

Contact pad 200 for applying a common voltage to the common electrode 580 of color filter substrate 500 is formed on a peripheral region of TFT substrate 300, and the contact pad 200 and the common electrode 580 are electrically connected to each other through conductive contact 400. For example, the conductive contact 400 may be made of a conductive silver paste or a conductive material, e.g., a mixture of a resin and a spacer coated with gold. Further, although conductive contact 400 may be formed cylindrical in this embodiment, conductive contact 400 may take any shape.

As described above, contact pad 200 comprises first electrode pattern 210 with open portion 215 formed inside, insulation layer 220 formed on first electrode pattern 210 and formed with contact via portion 270, and second electrode pattern 280 formed on insulation layer 220. First electrode pattern 210 and second electrode pattern 250 are electrically connected though contact via portion 270. For example, second electrode pattern 280 comprises a plurality of individual electrode patterns spaced apart from one another, and conductive contact 400 is positioned above the second electrode pattern 280 for connection. Conductive contact 400 may be positioned to entirely cover individual electrodes 280a to 280i of second electrode pattern 280, or to entirely cover only some of individual electrodes 280a to 280i and only partially cover others.

FIGS. 6A to 6E are sectional views illustrating a process of manufacturing the TFT substrate with the contact pad.

Referring to FIGS. 6A to 6E, a first conductive film is formed on a transparent insulative substrate 101 through a deposition method using chemical vapor deposition (CVD), plasma vapor deposition (PVD), or sputtering. Any one of Cr, MoW, Cr/Al, Cu, Al(Nd), Mo/Al and Mo/Al(Nd) or other appropriate combination of metals may be used as the first conductive film. The first conductive film may be made in the form of a multi-layered film.

Figure 6A:
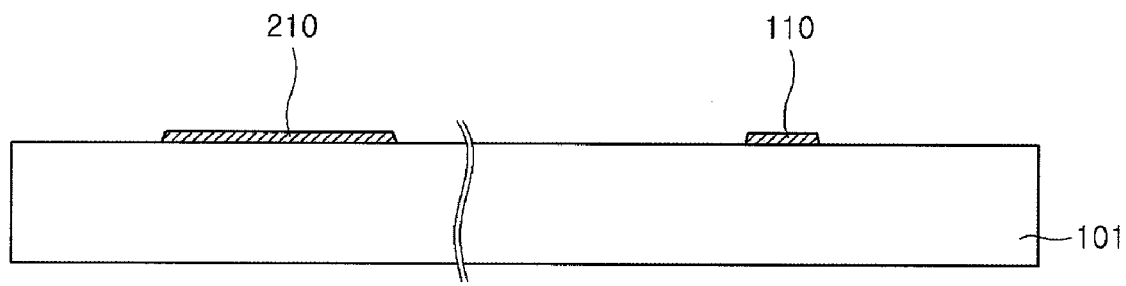
FIGS. 6A to 6E are sectional views illustrating a process for manufacturing the TFT substrate with the contact pad.

Thereafter, a photoresist is applied, and the first photoresist mask pattern is then formed by performing a photolithography process using a first mask. As shown in FIG. 6A, gate electrode 110 with a predetermined line width, and first electrode pattern 210 with open portion 215 inside are formed by etching. using a first photoresist mask pattern as an etching mask. Electrode pattern 210 has a lattice shape. Thereafter, the first photoresist pattern is removed by a predetermined stripping process. Although first electrode pattern 210 is formed when gate electrode 110 is formed in this embodiment, first electrode pattern 210 may also be formed following source-drain electrode formation.

Figure 6B:
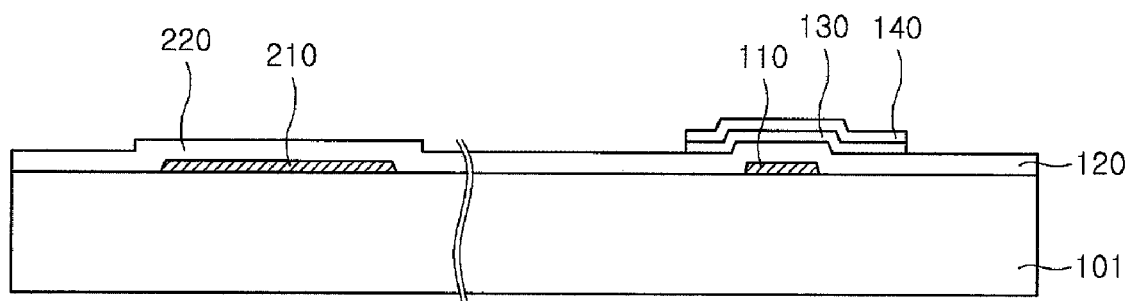

Referring to FIG. 6B, after insulation layers 120 and 220, an active layer 130 and an ohmic contact layer 140 are sequentially formed on the surface of substrate 101 shown in FIG. 6A, an active region of a TFT is formed by etching. using a second photoresist mask pattern (not shown).

Insulation layers 120 and 220 may be formed on substrate 101 through a deposition method using plasma enhanced chemical vapor deposition (PECVD), sputtering or other appropriate processes. Insulation layer 120 serves as a gate insulation film, and insulation layer 220 serves as an insulation layer for contact pad 200. An inorganic insulating material comprising silicon nitride or silicon dioxide may be used as insulation layers 120 and 220. Active layer 130 and ohmic contact layer 140 may be sequentially formed on insulation layers 120 and 220 using the aforementioned deposition methods. An amorphous silicon layer may be used as active layer 130, and an amorphous silicon layer doped with highly concentrated N-type impurities or silicide may be used as ohmic contact layer 140. Thereafter, a photoresist is applied on ohmic contact layer 140, and a second photoresist mask pattern is then formed through a photolithography process using a second mask. Ohmic contact layer 140 and active layer 130 are removed by performing an etching process using the second photoresist mask pattern as an etching mask and insulation layer 120 as an etch-stop film, so that an active region is formed on a top of gate electrode 110. Thereafter, the residue of the second photoresist mask pattern is removed by performing a predetermined stripping process.

Figure 6C:
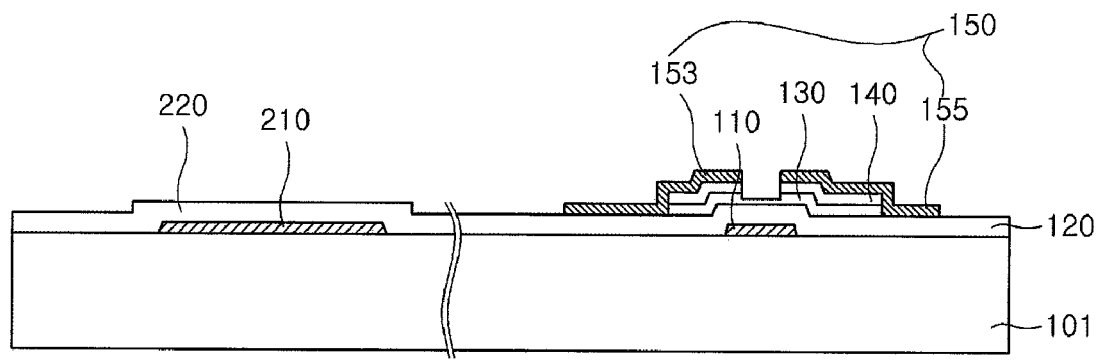

Referring to FIG. 6C, a second conductive film 150 is formed on the entire surface of the substrate 101 with the active region of the TFT formed thereon, and a data line (not shown) and source and drain electrodes 153 and 155 connected to the data line are then formed by etching using a third photoresist mask pattern (not shown).

Second conductive film 150 is formed on the entire surface of substrate 101 through a deposition method using CVD, PVD, or sputtering. A metallic, single- or multiple-layered film selected from at least one of Mo, Al, Cr and Ti may be used as the second conductive film 150. The same material as the first conductive film may be used as second conductive film 150. A photoresist is applied on second conductive film 150, and a third photoresist mask pattern is then formed by performing a lithography process using a mask. Second conductive film 150 is etched using the third photoresist mask pattern as an etching mask, and the third photoresist mask pattern is then removed. Thereafter, ohmic contact layer 140 formed in a region exposed through second conductive film 150 is removed by performing an etching process using etched second conductive film 150 as an etching mask, so that a channel made of active layer 130 is formed between source and drain electrodes 153 and 155.

Figure 6D:
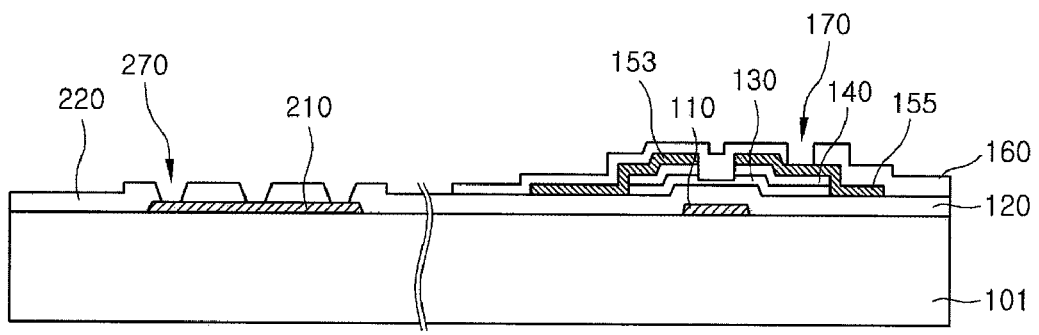

Referring to FIG. 6D, a protection layer 160 is formed on the entire surface of substrate 101 with the TFT and the data line formed thereon. Portions of protection layer 160 and insulation layer 220 are removed through an etching process using a fourth photoresist mask pattern, to form a contact via hole 170 and the contact via portion 270, respectively.

Figure 6E:
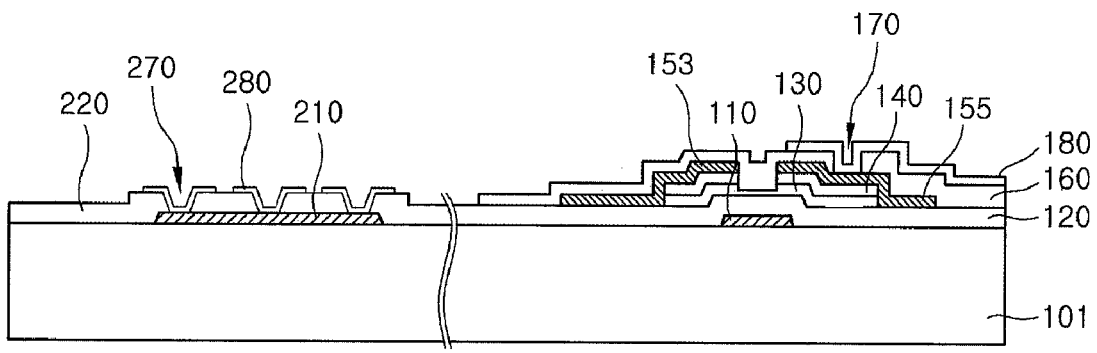

Referring to FIG. 6E, a third conductive film is formed on protection layer 160, and the third conductive film is then patterned using a fifth photoresist mask pattern (not shown) to form a pixel electrode 180 and second electrode pattern 280. For example, the third conductive film may be a transparent conductive film containing ITO or IZO. A plurality of single electrode patterns 280a to 280i of the second electrode pattern 280 are arranged to be spaced apart from one another at a predetermined interval.

As described above, according to an embodiment of the present invention, first electrode pattern 210 of a contact pad 200 is formed in a lattice shape and a plurality of single electrode patterns 280a to 280i of a second electrode pattern 280 are formed to be spaced apart from each other. Thus, even though a crack may be generated in an individual single electrode pattern (e.g., any one of 280a to 280i) by an external impact, the influence of such a crack can be minimized. Also, even though corrosion may be generated in an individual single electrode pattern, the corrosion can be prevented from progressing to other single electrode patterns. Consequently, the durability and corrosion resistance of contact pad 200 can be enhanced.

The foregoing is merely an exemplary embodiment of a contact pad 200 according to the present invention and a thin film transistor substrate and a liquid crystal display panel having the contact pad 200. Thus, the present invention is not limited thereto. It will be readily understood by those skilled in the art that various modifications and changes can be made thereto within the technical spirit and scope of the present invention. It is also apparent that the modifications and changes fall within the scope of the present invention defined by the appended claims.

What is claimed is:

1. A thin film transistor substrate, comprising:
   a substrate having a display region and a non-display region;
   a plurality of gate lines formed in one direction on the substrate;
   a plurality of data lines intersecting the plurality of gate lines while being insulated therefrom;
   a plurality of single pixels formed at intersections of the plurality of gate and data lines; and
   a contact pad formed in the non-display region of the substrate,
   wherein the contact pad comprises a first electrode pattern formed in a lattice shape and including a plurality of open portions inside so that the substrate is exposed at the open portions, an insulation layer formed on the first electrode pattern, a plurality of contact vias formed in the insulation layer to be spaced apart from one another and exposing a portion of the first electrode pattern, and a second electrode pattern formed on the insulation layer and including a plurality of single electrode patterns; and
   wherein the plurality of single electrode patterns are spaced apart from one another and each of the single electrode patterns is electrically connected to the first electrode pattern though a corresponding contact via,
   wherein a conductive contact is positioned above at least a portion of the second electrode pattern.

2. The thin film transistor substrate as claimed in claim 1, wherein each of the single pixels comprises a thin film transistor having gate and source-drain electrodes respectively connected to corresponding gate and data lines, and a pixel electrode connected to the thin film transistor.

3. The thin film transistor substrate as claimed in claim 2, wherein the first electrode pattern is made of the same material as the gate or data line.

4. The thin film transistor substrate as claimed in claim 2, wherein the second electrode pattern is made of the same material as the pixel electrode.

5. A liquid crystal display panel, comprising:
   a thin film transistor substrate including a first substrate having a display region and a non-display region, a plurality of single pixels formed on the first substrate to have a plurality of thin film transistors and pixel electrodes, and a contact pad formed in the non-display region of the first substrate;
   a color filter substrate including a second substrate, a plurality of color filters formed on the second substrate, and a common electrode formed on the plurality of color filters; and
   a conductive contact for electrically connecting the contact pad and the common electrode,
   wherein the contact pad comprises a first electrode pattern formed in a lattice shape and including a plurality of open portions inside so that the first substrate is exposed at the open portions, an insulation layer formed on the first electrode pattern, a plurality of contact vias formed in the insulation layer to be spaced apart from one another and exposing a portion of the first electrode pattern, and a second electrode pattern formed on the insulation layer and including a plurality of single electrode patterns; and
   wherein the plurality of single electrode patterns are spaced apart from one another and each of the single electrode patterns is electrically connected to the first electrode pattern through a corresponding contact via,
   wherein the conductive contact is positioned above at least a portion of the second electrode pattern.

6. The liquid crystal display panel as claimed in claim 5, wherein the conductive contact is formed to be electrically connected to at least a portion of the second electrode pattern.

7. The liquid crystal display panel as claimed in claim 5, wherein the conductive contact is made of a conductive silver paste or a mixture of a resin and a spacer coated with a conductive material.

8. The liquid crystal display panel as claimed in claim 5, wherein the plurality of open portions of the first electrode pattern are spaced apart from one another at a predetermined interval.

* * * * *